United States Patent
Koide et al.

(10) Patent No.: US 12,264,042 B2
(45) Date of Patent: Apr. 1, 2025

(54) ELEVATOR DERAILMENT DETECTION DEVICE

(71) Applicant: Mitsubishi Electric Corporation, Tokyo (JP)

(72) Inventors: Kazuaki Koide, Tokyo (JP); Yuya Hara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 1297 days.

(21) Appl. No.: 16/961,699

(22) PCT Filed: Mar. 23, 2018

(86) PCT No.: PCT/JP2018/011667
§ 371 (c)(1),
(2) Date: Jul. 13, 2020

(87) PCT Pub. No.: WO2019/180910
PCT Pub. Date: Sep. 26, 2019

(65) Prior Publication Data
US 2021/0362979 A1  Nov. 25, 2021

(51) Int. Cl.
*B66B 5/00* (2006.01)
*B66B 5/02* (2006.01)
(Continued)

(52) U.S. Cl.
CPC ...... *B66B 5/0031* (2013.01); *G01R 19/16571* (2013.01); *H02J 1/06* (2013.01)

(58) Field of Classification Search
CPC .......... B66B 1/34–3423; B66B 1/3492; B66B 1/46–467; B66B 1/50; B66B 5/00;
(Continued)

(56) References Cited

U.S. PATENT DOCUMENTS

2012/0024636 A1 *  2/2012  Niikawa ................... B66B 5/02
187/391

FOREIGN PATENT DOCUMENTS

| WO | 2011/010376 A1 | 1/2011 | |
|---|---|---|---|
| WO | WO-2017037787 A1 * | 3/2017 | ........... B66B 5/0031 |
| WO | 2018/198283 A1 | 11/2018 | |

OTHER PUBLICATIONS

International Search Report and Written Opinion mailed on May 15, 2018 for PCT/JP2018/011667 filed on Mar. 23, 2018, 9 pages including English Translation of the International Search Report.

* cited by examiner

*Primary Examiner* — Christopher Uhlir
(74) *Attorney, Agent, or Firm* — XSENSUS LLP

(57) ABSTRACT

Provided is an elevator derailment detection device, which is configured to bring a first conductive wire and a second conductive wire, which are provided in a hoistway in parallel with an elevating direction of an elevating body, into conduction with each other when derailment occurs, to thereby increase a voltage applied to the second conductive wire to a level higher than a voltage applied to the second conductive wire when no derailment has occurred, and is configured to detect the derailment through detection of the increase in voltage. The elevator derailment detection device is configured to inspect the behavior of a diagnosis target by performing control to switch a state of connection between a power supply unit and the diagnosis target between a conductive state and a non-conductive state, to thereby diagnose soundness of the diagnosis target.

17 Claims, 7 Drawing Sheets

(51) Int. Cl.
*G01R 19/165* (2006.01)
*H02J 1/06* (2006.01)

(58) Field of Classification Search
CPC ...... B66B 5/0006; B66B 5/0018–0037; B66B 5/02–022; B66B 5/025; B66B 5/12; B66B 5/125; B66B 7/028; B66B 11/0226
See application file for complete search history.

FIG.3

| | DERAILMENT DETECTION RELAY 82 | | FIRST CIRCUIT ABNORMALITY DETECTION RELAY 83 | | SECOND CIRCUIT ABNORMALITY DETECTION RELAY 84 | SWITCHING RELAY 85 | |
|---|---|---|---|---|---|---|---|
| | NO CONTACT 821 | NC CONTACT 822 | NO CONTACT 831 | NC CONTACT 832 | PHOTOTRANSISTOR 842 | NC CONTACT 851 | NC CONTACT 852 |
| WHEN NORMAL | OPEN | CLOSED | CLOSED | OPEN | ON | CLOSED | CLOSED |
| WHEN DERAILED | CLOSED | OPEN | CLOSED | OPEN | ON | CLOSED | CLOSED |
| FIRST CIRCUIT ABNORMALITY | OPEN | CLOSED | OPEN | CLOSED | ON | CLOSED | CLOSED |
| SECOND CIRCUIT ABNORMALITY | OPEN | CLOSED | CLOSED | OPEN | OFF | CLOSED | CLOSED |

FIG. 6

|  | FIRST CIRCUIT ABNORMALITY DETECTION RELAY 83 | | SECOND CIRCUIT ABNORMALITY DETECTION RELAY 84 | | SWITCHING RELAY 85 | |
|---|---|---|---|---|---|---|
|  | NO CONTACT 831 | NC CONTACT 832 | NO CONTACT 843 | NC CONTACT 844 | NC CONTACT 851 | NC CONTACT 852 |
| WHEN NORMAL | CLOSED | OPEN | CLOSED | OPEN | CLOSED | CLOSED |
| WHEN DERAILED | OPEN | CLOSED | OPEN | CLOSED | CLOSED | CLOSED |
| FIRST CIRCUIT ABNORMALITY | OPEN | CLOSED | CLOSED | OPEN | CLOSED | CLOSED |
| SECOND CIRCUIT ABNORMALITY | CLOSED | OPEN | OPEN | CLOSED | CLOSED | CLOSED |

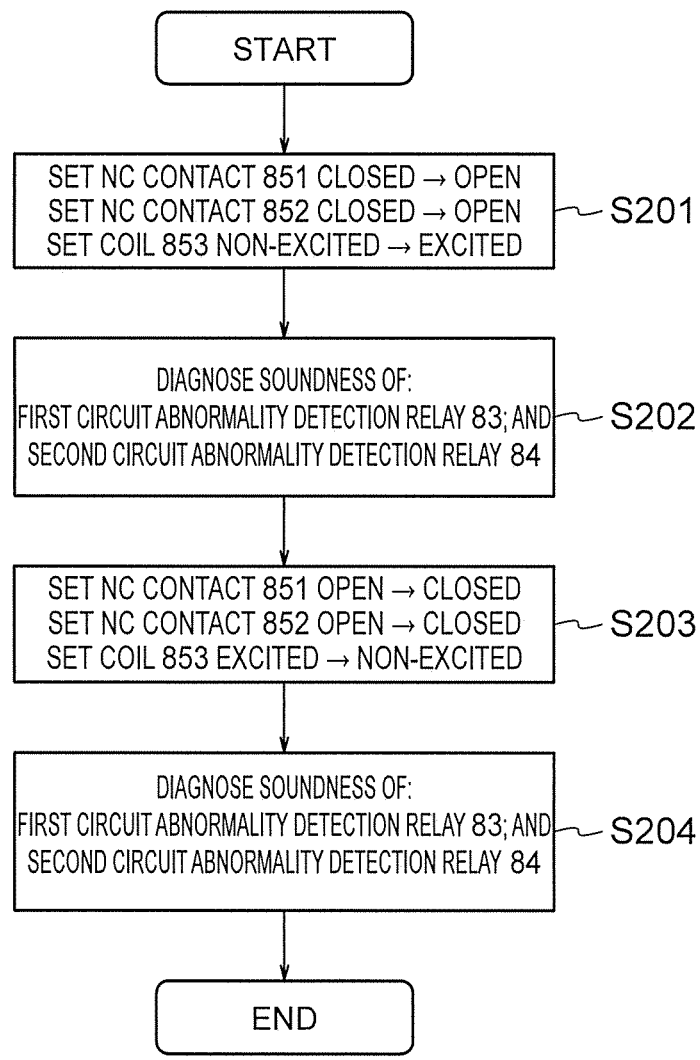

ELEVATOR DERAILMENT DETECTION DEVICE

CROSS-REFERENCE TO RELATED APPLICATION

The present application is based on PCT filing PCT/JP2018/011667, filed Mar. 23, 2018, the entire contents of which are incorporated herein by reference.

TECHNICAL FIELD

The present invention relates to an elevator derailment detection device configured to detect derailment in which an elevating body guided by a guide rail to raise and lower disengages from the guide rail.

BACKGROUND ART

Up to now, various technologies have been proposed as a technology for detecting derailment of an elevating body, such as a counterweight or a car (see, for example, Patent Literature 1).

Here, the elevator derailment detection device described in Patent Literature 1 includes a first conductive wire set at a positive potential and a second conductive wire set at a ground potential, which are stretched in parallel with a guide rail, and also includes a first contact element through which the first conductive wire passes and a second contact element through which the second conductive wire passes. When derailment of the elevating body occurs, the first conductive wire is brought into contact with the first contact element, and the second conductive wire is brought into contact with the second contact element.

The above-mentioned configuration of the derailment detection device has a mechanism in which derailment of the elevating body is detected based on the presence or absence of conductivity between the first conductive wire and the first contact element.

CITATION LIST

Patent Literature

[PTL 1] WO 2011/010376 A1

SUMMARY OF INVENTION

Technical Problem

In the related art described in Patent Literature 1, when the elevator is installed in a building having a high lifting height, a conductive wire stretched in parallel with a guide rail has a long length, and hence the resistance of the conductive wire increases, and further, the resistance of the conductive wire changes due to aging. Therefore, the detection accuracy of a current flowing through the conductive wire is unstable, and as a result, there is a possibility that derailment of an elevating body may fail to be detected with high accuracy. This requires a technology different from such a related art as a technology for detecting derailment of the elevating body.

The present invention has been made in order to solve the above-mentioned problem, and has an object to obtain an elevator derailment detection device configured to achieve improved stability in derailment detection of an elevating body.

Solution to Problem

According to one embodiment of the present invention, there is provided an elevator derailment detection device, which is configured to detect derailment in which an elevating body guided by a guide rail to raise and lower disengages from the guide rail, the elevator derailment detection device including: a first conductive wire and a second conductive wire, which are provided in a hoistway in parallel with an elevating direction of the elevating body; a derailment detector configured to detect the derailment; a power supply unit including a first DC power supply configured to output a first DC voltage to apply a voltage to the first conductive wire and a second DC power supply configured to output a second DC voltage, which is lower than the first DC voltage, to apply a voltage to the second conductive wire; a contact member, which is provided to the elevating body, and is configured to be brought into contact with the first conductive wire and the second conductive wire when the derailment occurs, to thereby bring the first conductive wire and the second conductive wire into conduction with each other; a switch configured to switch a state of connection between the power supply unit and a diagnosis target, which includes the derailment detector, between a conductive state and a non-conductive state; and a controller configured to perform diagnosis processing for diagnosing the diagnosis target, wherein the derailment detector is configured to detect the derailment by detecting that the voltage applied to the second conductive wire has increased to a level higher than the voltage applied to the second conductive wire when the derailment has not occurred, and wherein the controller is configured to control the switch in the diagnosis processing to inspect a behavior of the diagnosis target, to thereby diagnose soundness of the diagnosis target.

Advantageous Effects of Invention

According to the present invention, the elevator derailment detection device configured to achieve improved stability in derailment detection of the elevating body can be obtained.

BRIEF DESCRIPTION OF DRAWINGS

FIG. 3 is a table for showing respective states of a derailment detection relay, a first circuit abnormality detection relay, a second circuit abnormality detection relay, and a switching relay for each state of the elevator, in the first embodiment of the present invention.

FIG. 6 is a table for showing respective states of a first circuit abnormality detection relay, a second circuit abnormality detection relay, and a switching relay for each state of the elevator, in the second embodiment of the present invention.

FIG. 7 is a flow chart for illustrating a series of diagnostic processing procedures to be performed by a controller of an elevator control panel in the second embodiment of the present invention.

DESCRIPTION OF EMBODIMENTS

Now, an elevator derailment detection device according to each of exemplary embodiments of the present invention is described with reference to the accompanying drawings. In the illustration of the drawings, the same or corresponding components are denoted by the same reference symbols, and the overlapping description thereof is herein omitted.

First Embodiment

Figure 1:
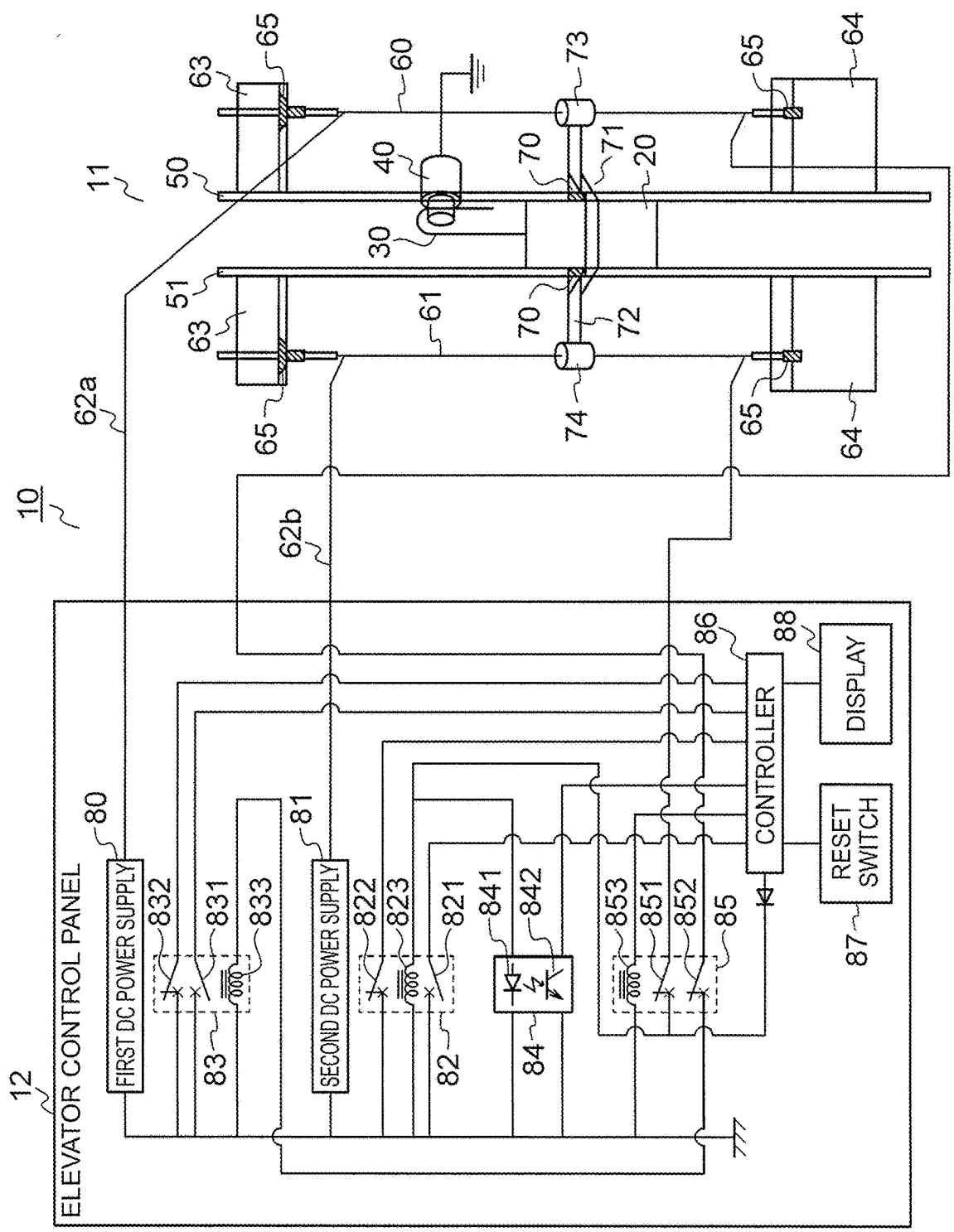
FIG. 1 is a schematic diagram for illustrating a configuration of an elevator system including an elevator derailment detection device according to a first embodiment of the present invention.

FIG. 1 is a schematic diagram for illustrating a configuration of an elevator system 10 including an elevator derailment detection device according to a first embodiment of the present invention. The elevator system 10 illustrated in FIG. 1 includes a traction-type elevator 11 and an elevator control panel 12 configured to control an operation of the elevator 11. In the elevator control panel 12, a derailment detection function, a circuit abnormality detection function, and a diagnosis function, which are described later, are implemented.

In the elevator 11, a car (not shown) and a counterweight 20 are provided in a hoistway so as to be able to raise and lower. The hoistway is also provided inside with: a pair of car guide rails (not shown) configured to guide the car to raise and lower; and a first guide rail 50 and a second guide rail 51, which correspond to a pair of counterweight guide rails, and which are configured to guide the counterweight 20 to raise and lower. The pair of car guide rails are arranged vertically so as to face each other. In the same manner, the first guide rail 50 and the second guide rail 51 corresponding to the pair of counterweight guide rails are erected vertically so as to face each other.

The car and the counterweight 20 are suspended in the hoistway by a main rope 30. As the main rope 30, for example, a rope or a belt is used. The main rope 30 is wound around a hoisting machine 40. The hoisting machine 40 is configured to generate a drive force for causing the car and the counterweight 20 to raise and lower in accordance with a control instruction issued through the elevator control panel 12.

A first conductive wire 60 and a second conductive wire 61 are provided in the hoistway in parallel with an elevating direction of the counterweight 20. The first conductive wire 60 and the second conductive wire 61 are also linearly provided without loosening. The first conductive wire and the second conductive wire 61 are components of the elevator derailment detection device.

The first conductive wire 60 is provided in parallel with the first guide rail 50. The first conductive wire 60 has both ends fixed via insulators 65 to an upper end fixing portion 63 provided near the upper end of the first guide rail 50 and a lower end fixing portion 64 provided near the lower end of the first guide rail 50. The second conductive wire 61 is provided in parallel with the second guide rail 51. The second conductive wire 61 has both ends fixed via the insulators 65 to the upper end fixing portion 63 provided near the upper end of the second guide rail 51 and the lower end fixing portion 64 provided near the lower end of the second guide rail 51.

The first conductive wire 60 and the second conductive wire 61 are made of, for example, a material having excellent conductivity and corrosion resistance. As another example, the first conductive wire 60 and the second conductive wire 61 are made of a material having excellent conductivity, and the surfaces of the first conductive wire 60 and the second conductive wire 61 are coated with a material having excellent corrosion resistance.

The counterweight 20 is provided with a contact member 71 via insulators 70. The contact member 71 is a component of the elevator derailment detection device.

Figure 2:
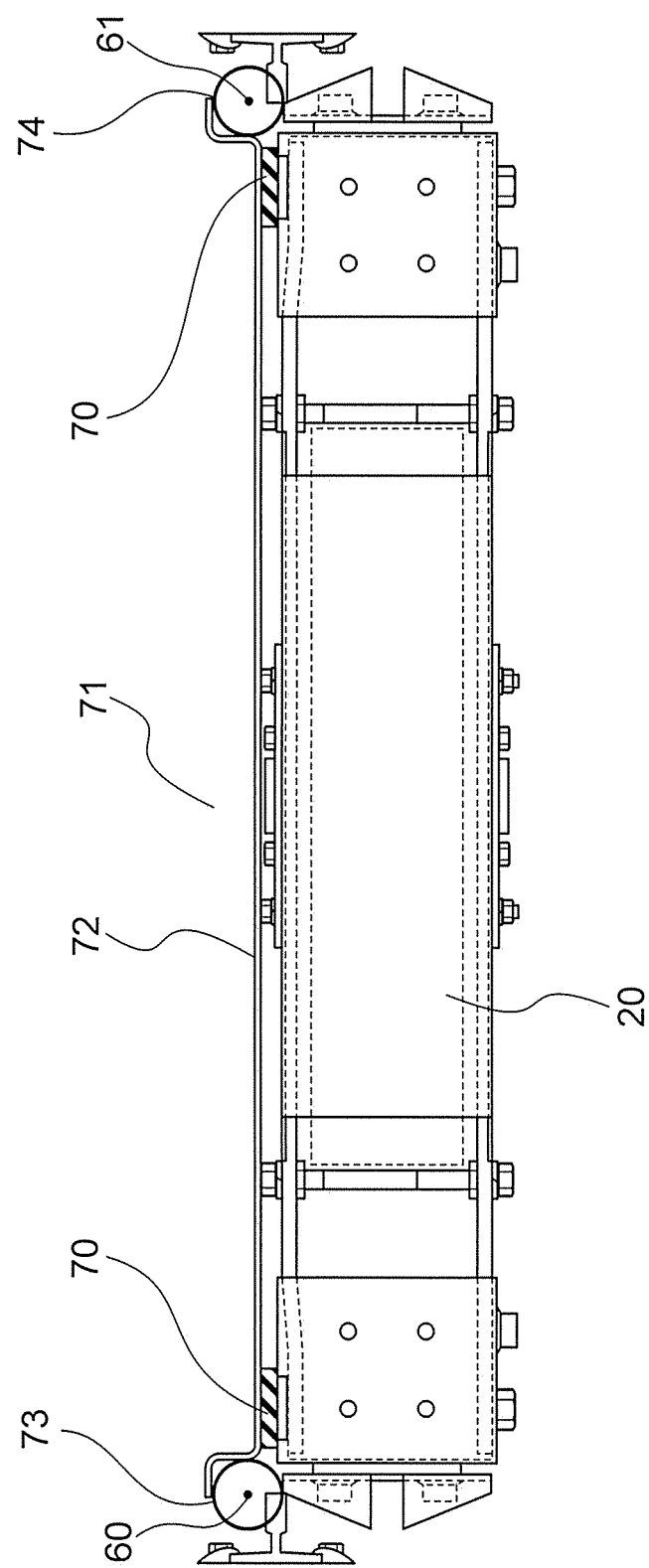
FIG. 2 is a top view for illustrating a configuration of a contact member in the first embodiment of the present invention.

The contact member 71 is made of a conductive material, for example, carbon steel. Now, a configuration example of the contact member 71 is described with reference to FIG. 1 along with FIG. 2. FIG. 2 is a top view for illustrating a configuration of the contact member 71 in the first embodiment of the present invention.

The contact member 71 includes a support portion 72 provided to the counterweight 20 via the insulators 70, a first contact portion 73 provided at one end of the support portion 72, and a second contact portion 74 provided at the other end of the support portion 72. The first contact portion 73 has a cylindrical shape, and surrounds the first conductive wire 60. The second contact portion 74 has a cylindrical shape, and surrounds the second conductive wire 61.

When derailment has not occurred, that is, when the counterweight 20 has not disengaged from the first guide rail 50 and the second guide rail 51, the first contact portion 73 and the second contact portion 74 are not brought into contact with the first conductive wire 60 and the second conductive wire 61, respectively. Therefore, in such a case, the first conductive wire 60 and the second conductive wire 61 are not brought into conduction with each other.

Meanwhile, when derailment has occurred, that is, when the counterweight 20 has disengaged from the first guide rail 50 or the second guide rail 51, the first contact portion 73 and the second contact portion 74 are brought into contact with the first conductive wire 60 and the second conductive wire 61, respectively. Therefore, in such a case, the first conductive wire 60 and the second conductive wire 61 are brought into conduction with each other via the contact member 71.

In this manner, the contact member 71 is provided to the counterweight 20, and is brought into contact with the first conductive wire 60 and the second conductive wire 61 when derailment occurs, to thereby bring the first conductive wire 60 and the second conductive wire 61 into conduction with each other.

Returning to the description of FIG. 1, the elevator control panel 12 includes components of the elevator derailment detection device. Specifically, the elevator control panel 12 includes: a power supply unit including a first DC power supply 80 and a second DC power supply 81; a derailment detection relay 82, which is an example of a derailment detector; a first circuit abnormality detection relay 83, which is an example of a first circuit abnormality detector; a second circuit abnormality detection relay 84, which is an example of a second circuit abnormality detector; a switching relay 85, which is an example of a switch; a controller 86; a reset switch 87; and a display 88.

The first DC power supply 80 is configured to cause a current to flow through the first conductive wire 60, and the second DC power supply 81 is configured to cause a current to flow through the second conductive wire 61. A first DC voltage being the voltage of the first DC power supply 80 is, for example, 24 V, and a second DC voltage being the voltage of the second DC power supply 81 is lower than the first DC voltage, and is, for example, 12 V.

In this manner, the first DC power supply 80 outputs the first DC voltage, to thereby apply the voltage to the first conductive wire 60. The second DC power supply 81 also outputs the second DC voltage lower than the first DC voltage, to thereby apply the voltage to the second conductive wire 61. Hereinafter, it is assumed that, as an example, the first DC voltage is 24 V and the second DC voltage is 12 V.

The derailment detection relay 82 is configured to detect derailment. Specifically, the derailment detection relay 82 includes a normally open contact (hereinafter referred to as "NO contact") 821, a normally closed contact (hereinafter referred to as "NC contact") 822, and a coil 823. The derailment detection relay 82 is a force-guided contact relay, and is classified as a contact relay.

The first circuit abnormality detection relay 83 is configured to detect a first circuit abnormality, in which the first DC power supply 80 and the first conductive wire 60 are brought into a non-conductive state with each other. Specifically, the first circuit abnormality detection relay 83 includes an NO contact 831, an NC contact 832, and a coil 833. The first circuit abnormality detection relay 83 is a force-guided contact relay, and is classified as a contact relay.

The second circuit abnormality detection relay 84 is configured to detect a second circuit abnormality, in which the second DC power supply 81 and the second conductive wire 61 are brought into a non-conductive state with each other. Specifically, the second circuit abnormality detection relay 84 includes a light emitting diode 841 and a phototransistor 842. The second circuit abnormality detection relay 84 is a photocoupler, and is classified as a non-contact relay. This photocoupler is connected to an overcurrent breaker (not shown) for detecting a short circuit due to an abnormality of an internal semiconductor element.

The switching relay 85 is configured to switch a state of connection between the power supply unit and a diagnosis target, which is described later, between a conductive state and a non-conductive state. Specifically, the switching relay 85 includes an NC contact 851, an NC contact 852, and a coil 853. The switching relay 85 is a force-guided contact relay, and is classified as a contact relay.

The case of using a contact relay as each of the derailment detection relay 82, the first circuit abnormality detection relay 83, and the switching relay 85 has been described as an example, but a non-contact relay may be used instead of a contact relay. In addition, the case of using a non-contact relay as the second circuit abnormality detection relay 84 has been described as an example, but a contact relay may be used instead of a non-contact relay.

One end of the first DC power supply 80 is connected to one end of the first conductive wire 60. The other end of the first DC power supply 80 is connected to the other end of the first conductive wire 60 via the coil 833 of the first circuit abnormality detection relay 83 and the NC contact 852 of the switching relay 85.

One end of the second DC power supply 81 is connected to one end of the second conductive wire 61. The other end of the second DC power supply 81 is connected to the other end of the second conductive wire 61 via a parallel circuit formed by connecting the coil 823 and the light emitting diode 841 in parallel with each other and the NC contact 851 of the switching relay 85.

The derailment detection relay 82 is configured so that a voltage range in which the derailment detection relay 82 operates correctly has a lower limit higher than the second DC voltage, that is, 12 V, and an upper limit of about the first DC voltage, that is, about 24V. For example, when a voltage higher than 12 V is applied to the coil 823, the NO contact 821 is brought into a closed state, and the NC contact 822 is brought into an open state.

In addition, the derailment detection relay 82 operates when an electric signal is input from the controller 86. That is, in the derailment detection relay 82, when an electric signal is input from the controller 86, the coil 823 is brought into an excited state, to thereby bring the NO contact 821 into a closed state and bring the NC contact 822 into an open state.

The first circuit abnormality detection relay 83 is configured so that a voltage range in which the first circuit abnormality detection relay 83 operates correctly has a lower limit of about the second DC voltage, that is, about 12 V, and an upper limit of about the first DC voltage, that is, about 24 V. For example, when a voltage of 24 V is applied to the coil 833, the NO contact 831 is brought into a closed state, and the NC contact 832 is brought into an open state.

The second circuit abnormality detection relay 84 is configured so that a voltage range in which the second circuit abnormality detection relay 84 operates correctly has a lower limit of about the second DC voltage, that is, about 12 V, and an upper limit of about the first DC voltage, that is, about 24 V. For example, when a voltage of 12 V is applied to the light emitting diode 841, the phototransistor 842 is brought into an on state.

The switching relay 85 operates when an electric signal is input from the controller 86, to thereby switch the state of connection between the power supply unit and the diagnosis target from a conductive state to a non-conductive state. That is, the switching relay 85 has the state of the coil 853 switched between an excited state and a non-excited state under control of the controller 86. When the coil 853 is brought into an excited state under control of the controller 86, the NC contact 851 and the NC contact 852 are both brought into an open state.

The controller 86 is implemented by, for example, a microcomputer configured to execute calculation processing, a read only memory (ROM) configured to store program data, fixed value data, and other such data, and a random access memory (RAM) in which the stored pieces of data are updated and rewritten in order.

Respective detection results of the derailment detection relay 82, the first circuit abnormality detection relay 83, and the second circuit abnormality detection relay 84, namely, states of the respective contacts, are input to the controller 86. The controller 86 determines based on those inputs whether each of derailment, a first circuit abnormality, and a second circuit abnormality has occurred.

When determining that derailment, a first circuit abnormality, a second circuit abnormality, or another such abnormality has occurred, the controller 86 emergency-stops the elevator 11.

The controller 86 is configured to perform diagnosis processing for diagnosing a diagnosis target including the derailment detection relay 82, the first circuit abnormality detection relay 83, and the second circuit abnormality detection relay 84. When performing the diagnosis processing, the controller 86 controls the state of the coil 853 to an excited state, to thereby bring both the NC contact 851 and the NC contact 852 into an open state. Meanwhile, when the diagnosis processing is not to be performed by the controller 86, the state of the coil 853 is not brought into an excited state, and hence the NC contact 851 and the NC contact 852 both remain in a closed state.

The reset switch 87 is switchable between an on state and an off state, and outputs an on signal to the controller 86 when the reset switch 87 is turned on. In a case where the controller 86 temporarily determines that derailment has occurred in response to the detection of the derailment performed by the derailment detection relay 82, when an on signal is input from the reset switch 87, the controller 86 redetermines that derailment has not occurred.

For example, when derailment actually occurs in the elevator 11, the controller 86 determines that derailment has occurred based on a detection result obtained by the derailment detection relay 82. After that, when recovery work is performed by a maintenance person and then the elevator 11 becomes normal, the reset switch 87 is turned on through the operation of the maintenance person. When the reset switch 87 is turned on, an on signal is input to the controller 86. With this input, the controller 86 changes its determination that derailment has occurred to determination that no derailment has occurred.

The display 88 is configured to display various kinds of information under control of the controller 86. For example, the controller 86 causes the display 88 to display information for notifying a result of diagnosing soundness of a diagnosis target. Further, for example, when determining that there has occurred derailment, a first circuit abnormality, a second circuit abnormality, or another such abnormality, the controller 86 causes the display 88 to display information for notifying that the abnormality has occurred.

Now, each of the derailment detection function, the circuit abnormality detection function, and the diagnosis function of the elevator control panel 12 is described with reference to FIG. 3. FIG. 3 is a table for showing respective states of the derailment detection relay 82, the first circuit abnormality detection relay 83, the second circuit abnormality detection relay 84, and the switching relay 85 for each state of the elevator 11, in the first embodiment of the present invention.

First, an operation of the elevator control panel 12 performed when the elevator 11 is normal is described. When the hoisting machine 40 is driven, the car is guided by the pair of car guide rails to raise and lower, and the counterweight 20 is guided by the pair of counterweight guide rails, namely, the first guide rail 50 and the second guide rail 51, to raise and lower. In addition, the first contact portion 73 is not brought into contact with the first conductive wire 60, and the second contact portion 74 is not brought into contact with the second conductive wire 61. Therefore, the first conductive wire 60 and the second conductive wire 61 are not brought into conduction with each other.

A voltage of 24 V output from the first DC power supply 80 is applied to the first conductive wire 60 and the coil 833 of the first circuit abnormality detection relay 83. In this case, the coil 833 is excited to bring the NO contact 831 into a closed state and bring the NC contact 832 into an open state.

A voltage of 12 V output from the second DC power supply 81 is applied to the second conductive wire 61 and the light emitting diode 841 of the second circuit abnormality detection relay 84. In this case, the phototransistor 842 is brought into an on state.

The voltage of 12 V output from the second DC power supply 81 is also applied to the second conductive wire 61 and the coil 823 of the derailment detection relay 82. However, as described above, the voltage range in which the derailment detection relay 82 operates correctly is higher than 12 V, and hence the derailment detection relay 82 does not operate. In this case, the NO contact 821 remains in an open state, and the NC contact 822 remains in a closed state.

In this manner, when the elevator 11 is normal, as shown in FIG. 3, the NO contact 821, the NC contact 822, the NO contact 831, the NC contact 832, and the phototransistor 842 are in an open state, a closed state, a closed state, an open state, and an on state, respectively.

When the NO contact 821, the NC contact 822, the NO contact 831, the NC contact 832, and the phototransistor 842 are in an open state, a closed state, a closed state, an open state, and an on state, respectively, the controller 86 determines that the elevator 11 is normal.

<Derailment Detection Function>

Next, the derailment detection function of the elevator control panel 12 is described.

When derailment occurs in the elevator 11, the counterweight 20 is tilted, and hence the contact member 71 is tilted. This brings, as described above, the first contact portion 73 and the second contact portion 74 into contact with the first conductive wire 60 and the second conductive wire 61, respectively. Therefore, the first conductive wire 60 and the second conductive wire 61 are brought into conduction with each other via the contact member 71.

It is assumed here that the following conditions (a) and (b) are established for a first wiring 62a, which is a wiring for connecting the first DC power supply 80 and the first conductive wire 60 to each other, a second wiring 62b, which is a wiring for connecting the second DC power supply 81 and the second conductive wire 61 to each other, the first conductive wire 60, and the second conductive wire 61.

Condition (a): The first wiring 62a, the first conductive wire 60, the second wiring 62b, and the second conductive wire 61 have the same resistance value per length.

Condition (b): A sum of the length of the first wiring 62a and the length of the first conductive wire 60 is equal to a sum of the length of the second wiring 62b and the length of the second conductive wire 61.

In this case, assuming that a voltage drop from the second DC power supply 81 configured to output a voltage of 12 V to a contact position between the contact member 71 and the second conductive wire 61 is $Vd$, a voltage drop from the first DC power supply 80 configured to output a voltage of 24 V to a contact position between the contact member 71 and the first conductive wire 60 becomes $Vd \times 2$.

The voltage drops $Vd$ and $Vd \times 2$ change in value due to the respective resistances of the first conductive wire 60, the second conductive wire 61, the first wiring 62a, and the second wiring 62b, and hence the respective resistances are designed to be sufficiently small, to thereby be able to reduce the value of the voltage drop $Vd$ to a sufficiently low level.

Here, regarding the first conductive wire 60 and the second conductive wire 61 in conduction with each other via the contact member 71, assuming that a voltage drop from the first conductive wire 60 to the second conductive wire 61 is $Vc$, when following Expression (1) is satisfied, a voltage output from the first DC power supply 80 is applied to the second conductive wire 61. In this case, the voltage applied to the second conductive wire 61 increases to a level higher than a voltage applied to the second conductive wire 61 only by the second DC power supply 81 when no derailment has occurred.

$$24 - 2 \times Vd - Vc > 12 - Vd \quad (1)$$

In addition, assuming that: a voltage drop from the contact position between the contact member 71 and the second conductive wire 61 to the derailment detection relay 82 is Ve; an operation voltage of the relay is Vr; and a voltage applied to the relay is Vs, when following Expression (2) is satisfied, the relay operates to bring the NO contact 821 into a closed state and bring the NC contact 822 into an open state.

$$Vs = 24 - 2 \times Vd - Vc - Ve > Vr \quad (2)$$

To investigate the voltage drop Vc, when the contact member 71 is made of carbon steel as described above, the contact member 71 has an electrical resistivity of 16.9 (μΩ·cm). Therefore, assuming that the contact member 71 has a length of L (m) and a cross-section area of S (mm$^2$), a resistance R of the contact member 71 is expressed by following Expression (3).

$$R = 16.9 \times L/S \times 0.01 \quad (3)$$

As can be understood from Expression (3), the cross-section area S is designed to be sufficiently large as compared to the length L, to thereby be able to reduce the resistance R to a sufficiently small level, with the result that the value of the voltage drop Vc can be reduced to a sufficiently low level.

The voltage drop Ve also changes in value due to the resistance of a current path from the contact position between the contact member 71 and the second conductive wire 61 to the derailment detection relay 82, and hence its resistance is designed to be sufficiently small, to thereby be able to reduce the value of the voltage drop Ve to a sufficiently low level.

As described above, the derailment detection relay is configured to operate when the applied voltage becomes higher than the second DC voltage, that is, 12 V. Therefore, in order to satisfy Expressions (1) and (2) when the first conductive wire 60 and the second conductive wire 61 are brought into conduction with each other via the contact member 71, it suffices that, as described above, the values of the voltage drops Vc, Vd, and Ve are designed to be sufficiently small. With such design, when derailment occurs, the derailment detection relay 82 operates to bring the NO contact 821 into a closed state and bring the NC contact 822 into an open state.

Meanwhile, even when derailment occurs, no influence is exerted on an operation of the first circuit abnormality detection relay 83 and an operation of the second circuit abnormality detection relay 84. That is, the coil 833 of the first circuit abnormality detection relay 83 remains excited, and hence the NO contact 831 and the NC contact 832 remain in a closed state and an open state, respectively. In the same manner, the phototransistor 842 of the second circuit abnormality detection relay 84 remains in an on state.

In this manner, when derailment occurs, as shown in FIG. 3, the derailment detection relay 82 has the NO contact 821 switched from the open state to the closed state, and has the NC contact 822 switched from the closed state to the open state.

That is, the derailment detection relay 82 is configured to detect derailment by detecting that the voltage applied to the second conductive wire 61 has increased to a level higher than the voltage applied to the second conductive wire 61 when no derailment has occurred. More specifically, the derailment detection relay 82 operates when the voltage applied to the second conductive wire 61 has increased to a level higher than the voltage applied to the second conductive wire 61 when no derailment has occurred, to thereby detect derailment.

The controller 86 determines that derailment has occurred in response to a detection result obtained by the derailment detection relay 82, that is, a result that the NO contact 821 has been brought into a closed state and the NC contact 822 has been brought into an open state.

<Circuit Abnormality Detection Function>

Next, the circuit abnormality detection function of the elevator control panel 12 is described.

In a case where the above-mentioned first circuit abnormality or second circuit abnormality has occurred, even when derailment occurs in the elevator 11, the elevator control panel 12 fails to detect the derailment. In view of this, the elevator control panel 12 is configured to detect such a circuit abnormality. There is a break in the first conductive wire 60 as a specific example of the first circuit abnormality, and there is a break in the second conductive wire 61 as a specific example of the second circuit abnormality.

Even in a case where no derailment has occurred in the elevator 11, when there occurs a break in the first conductive wire 60 as an example of the first circuit abnormality, the voltage of the first DC power supply 80 stops being applied to the coil 833 of the first circuit abnormality detection relay 83. In this case, the coil 833 is switched from an excited state to a non-excited state, to thereby bring the NO contact 831 into an open state and bring the NC contact 832 into a closed state.

In this manner, when a first circuit abnormality occurs, as shown in FIG. 3, the first circuit abnormality detection relay 83 has the NO contact 831 switched from the closed state to the open state, and has the NC contact 832 switched from the open state to the closed state.

That is, the first circuit abnormality detection relay 83 is configured to detect a first circuit abnormality by detecting that no voltage is being applied to the first conductive wire 60. More specifically, the first circuit abnormality detection relay 83 operates when the voltage is being applied to the first conductive wire 60, and avoids operating when no voltage is being applied to the first conductive wire 60, to thereby detect a first circuit abnormality.

The controller 86 determines that a first circuit abnormality has occurred in response to a detection result obtained by the first circuit abnormality detection relay 83, namely, a result that the NO contact 831 has been brought into an open state and the NC contact 832 has been brought into a closed state.

Even in a case where no derailment has occurred in the elevator 11, when there occurs a break in the second conductive wire 61 as an example of the second circuit abnormality, the voltage of the second DC power supply 81 stops being applied to the light emitting diode 841 of the second circuit abnormality detection relay 84. In this case, the light emitting diode 841 stops emitting light, to thereby bring the phototransistor 842 into an off state.

In this manner, when a second circuit abnormality occurs, as shown in FIG. 3, the second circuit abnormality detection relay 84 has the phototransistor 842 switched from an on state to an off state.

That is, the second circuit abnormality detection relay 84 is configured to detect a second circuit abnormality by detecting that no voltage is being applied to the second conductive wire 61. More specifically, the second circuit abnormality detection relay 84 operates when the voltage is being applied to the second conductive wire 61, and avoids operating when no voltage is being applied to the second conductive wire 61, to thereby detect a second circuit abnormality.

The controller 86 determines that a second circuit abnormality has occurred in response to a detection result obtained by the second circuit abnormality detection relay 84, namely, a result that the phototransistor 842 has been brought into an off state.

<Diagnosis Function>

Figure 4:
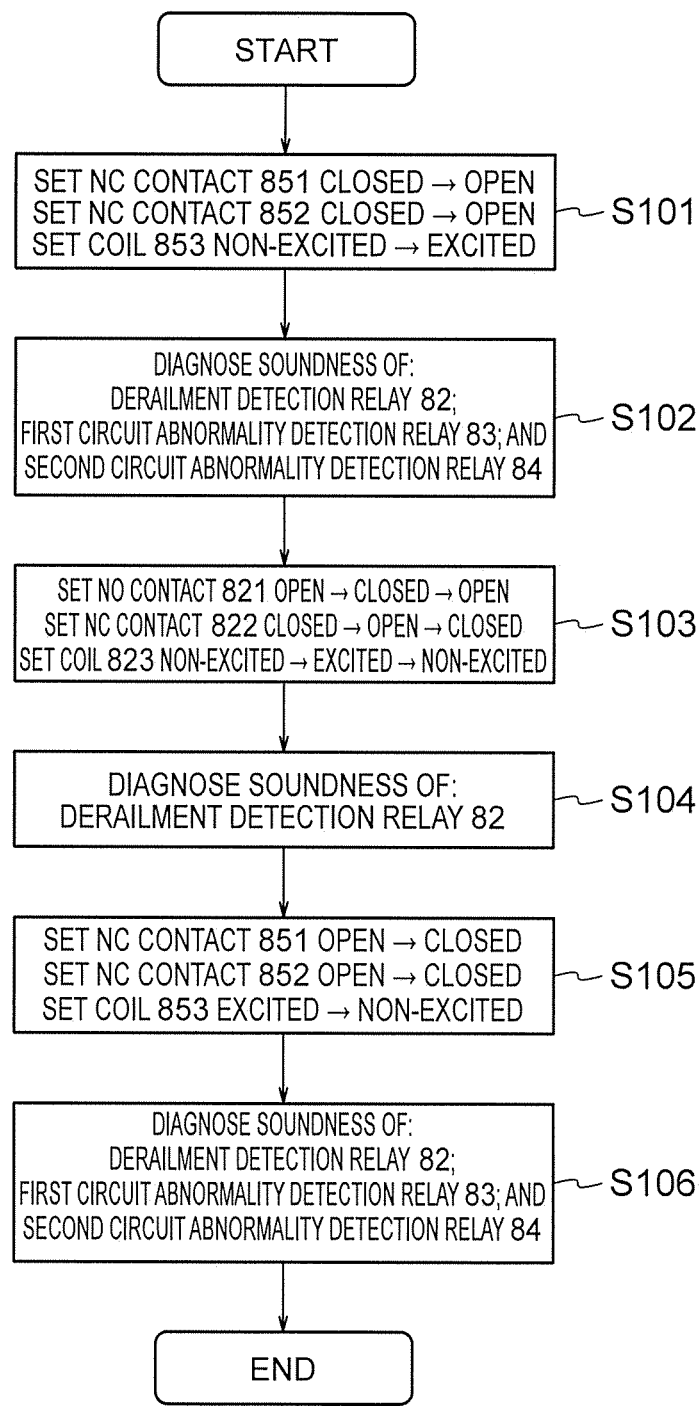
FIG. 4 is a flow chart for illustrating a series of diagnostic processing procedures to be performed by a controller of an elevator control panel in the first embodiment of the present invention.

Next, the diagnosis function of the elevator control panel 12 is described with reference to FIG. 4. FIG. 4 is a flow chart for illustrating a series of diagnostic processing procedures to be performed by the controller 86 of the elevator control panel 12 in the first embodiment of the present invention.

The diagnosis processing is performed, for example, while the car is stopped. In addition, the diagnosis processing is performed with a frequency, for example, each time the car of the elevator 11 being operated stops after traveling. As another example, the diagnosis processing is performed on condition that the car of the elevator 11 being operated has been stopped for a fixed time period.

In Step S101, the controller 86 controls the state of the coil 853 of the switching relay 85 to an excited state, to thereby bring both the NC contact 851 and the NC contact 852 into an open state. After the execution of Step S101, the processing proceeds to Step S102.

In Step S102, the controller 86 inspects behaviors of the derailment detection relay 82, the first circuit abnormality detection relay 83, and the second circuit abnormality detection relay 84, which are involved in the execution of Step S101, to thereby diagnose the soundness of the derailment detection relay 82, the first circuit abnormality detection relay 83, and the second circuit abnormality detection relay 84. After the execution of Step S102, the processing proceeds to Step S103.

Here, when the NC contact 851 and the NC contact 852 are both switched from a closed state to an open state, the state of connection between the power supply unit and the diagnosis target is switched from a conductive state to a non-conductive state.

In this case, when the derailment detection relay 82 is normal, the NO contact 821 remains in an open state, and the NC contact 822 remains in a closed state. In addition, when the first circuit abnormality detection relay 83 is normal, the NO contact 831 is switched from a closed state to an open state, and the NC contact 832 is switched from an open state to a closed state. Further, when the second circuit abnormality detection relay 84 is normal, the phototransistor 842 is switched from an on state to an off state.

In view of this, the controller 86 is configured to switch the state of connection between the power supply unit and the diagnosis target from a conductive state to a non-conductive state, to thereby inspect the behavior of the diagnosis target.

Specifically, the controller 86 determines that the derailment detection relay 82 is sound when the NO contact 821 remains in an open state and the NC contact 822 remains in a closed state, and otherwise determines that the derailment detection relay 82 is unsound.

Meanwhile, the controller 86 determines that the first circuit abnormality detection relay 83 is sound when the NO contact 831 is switched from a closed state to an open state and the NC contact 832 is switched from an open state to a closed state, and otherwise determines that the first circuit abnormality detection relay 83 is unsound.

Further, the controller 86 determines that the second circuit abnormality detection relay 84 is sound when the phototransistor 842 is switched from an on state to an off state, and otherwise determines that the second circuit abnormality detection relay 84 is unsound.

Subsequently, in Step S103, the controller 86 outputs an electric signal to the coil 823 of the derailment detection relay 82, and then stops outputting the electric signal. After the execution of Step S103, the processing proceeds to Step S104.

Subsequently, in Step S104, the controller 86 inspects behavior of the derailment detection relay 82, which is involved in the execution of Step S103, to thereby diagnose the soundness of the derailment detection relay 82. After the execution of Step S104, the processing proceeds to Step S105.

Here, when the derailment detection relay 82 is normal, the NO contact 821 and the NC contact 822 are changed as follows under the above-mentioned control of the controller 86. That is, when an electric signal is input from the controller 86 to the derailment detection relay 82, the coil 823 is switched from a non-excited state to an excited state. In this case, the NO contact 821 is switched from an open state to a closed state, and the NC contact 822 is switched from a closed state to an open state.

In addition, when the input of the electric signal from the controller 86 to the derailment detection relay 82 is cut off, the coil 823 is switched from an excited state to a non-excited state. In this case, the NO contact 821 is switched from a closed state to an open state, and the NC contact 822 is switched from an open state to a closed state.

In view of this, the controller 86 is configured to switch the state of connection between the power supply unit and the diagnosis target from a conductive state to a non-conductive state, output an electric signal to the diagnosis target, and then stop outputting the electric signal, to thereby inspect the behavior of the diagnosis target.

Specifically, the controller 86 determines that the derailment detection relay 82 is sound when the NO contact 821 is switched from an open state to a closed state and then to an open state sequentially and the NC contact 822 is switched from a closed state to an open state and then to a closed state sequentially, and otherwise determines that the derailment detection relay 82 is unsound.

Subsequently, in Step S105, the controller 86 controls the state of the coil 853 of the switching relay 85 to a non-excited state, to thereby bring both the NC contact 851 and the NC contact 852 into a closed state. After the execution of Step S105, the processing proceeds to Step S106.

In Step S106, the controller 86 inspects behaviors of the derailment detection relay 82, the first circuit abnormality detection relay 83, and the second circuit abnormality detection relay 84, which are involved in the execution of Step S105, to thereby diagnose the soundness of the derailment detection relay 82, the first circuit abnormality detection relay 83, and the second circuit abnormality detection relay 84. After the execution of Step S106, the processing is terminated.

Here, when the NC contact 851 and the NC contact 852 are both switched from an open state to a closed state, the state of connection between the power supply unit and the diagnosis target is switched from a non-conductive state to a conductive state.

In this case, when the derailment detection relay 82 is normal, the NO contact 821 remains in an open state, and the NC contact 822 remains in a closed state. In addition, when the first circuit abnormality detection relay 83 is normal, the NO contact 831 is switched from an open state to a closed state, and the NC contact 832 is switched from a closed state to an open state. Further, when the second circuit abnormality detection relay 84 is normal, the phototransistor 842 is switched from an off state to an on state.

In view of this, the controller 86 is configured to switch the state of connection between the power supply unit and the diagnosis target from a conductive state to a non-conductive state and then switch the state from a non-conductive state to a conductive state, to thereby inspect the behavior of the diagnosis target.

Specifically, the controller 86 determines that the derailment detection relay 82 is sound when the NO contact 821 remains in an open state and the NC contact 822 remains in a closed state, and otherwise determines that the derailment detection relay 82 is unsound.

Meanwhile, the controller 86 determines that the first circuit abnormality detection relay 83 is sound when the NO contact 831 is switched from an open state to a closed state and the NC contact 832 is switched from a closed state to an open state, and otherwise determines that the first circuit abnormality detection relay 83 is unsound.

Further, the controller 86 determines that the second circuit abnormality detection relay 84 is sound when the phototransistor 842 is switched from an off state to an on state, and otherwise determines that the second circuit abnormality detection relay 84 is unsound.

In this manner, the controller 86 controls the switching relay 85 in the diagnosis processing to inspect the behavior of the diagnosis target, to thereby diagnose the soundness of the diagnosis target. As a result of performing the diagnosis processing, the controller 86 emergency-stops the elevator 11 when there is an unsound spot.

The controller 86 may be configured to further diagnose the soundness of the reset switch 87 based on whether an on signal is input from the reset switch 87 while the above-mentioned diagnosis processing is being performed. It is considered that, while the diagnosis processing is being performed, the reset switch 87 is not operated by the maintenance person, and therefore an on signal is not input from the reset switch 87 to the controller 86. In view of this, the controller 86 determines that the reset switch 87 is unsound when an on signal is input from the reset switch 87 while the above-mentioned diagnosis processing is being performed, and otherwise determines that the reset switch 87 is sound.

As described above, according to the first embodiment, the elevator derailment detection device includes: a first conductive wire and a second conductive wire, which are provided in a hoistway in parallel with the elevating direction of an elevating body; a derailment detector configured to detect derailment; a power supply unit including a first DC power supply configured to output a first DC voltage to apply a voltage to the first conductive wire and a second DC power supply configured to output a second DC voltage, which is lower than the first DC voltage, to apply a voltage to the second conductive wire; and a contact member, which is provided to the elevating body, and is configured to be brought into contact with the first conductive wire and the second conductive wire when the derailment occurs, to thereby bring the first conductive wire and the second conductive wire into conduction with each other. The above-mentioned derailment detector is configured to detect derailment by detecting that the voltage applied to the second conductive wire has increased to a level higher than the voltage applied to the second conductive wire when no derailment has occurred.

In addition to the above-mentioned components, the above-mentioned elevator derailment detection device further includes: a switch configured to switch a state of connection between the power supply unit and a diagnosis target, which includes the derailment detector, between the conductive state and the non-conductive state; and a controller configured to perform diagnosis processing for diagnosing the diagnosis target. The above-mentioned controller is configured to control the switch in the diagnosis processing to inspect the behavior of the diagnosis target, to thereby diagnose the soundness of the diagnosis target.

With this configuration, through the above-mentioned derailment detection function, the elevator derailment detection device can achieve improved stability in derailment detection of the elevating body. In addition to the above-mentioned derailment detection function, the elevator derailment detection device further includes the above-mentioned diagnosis function, and can therefore monitor whether the derailment detection function is normal or abnormal, to thereby be able to secure fail-safe.

In addition to the above-mentioned components, the above-mentioned elevator derailment detection device further includes a first circuit abnormality detector configured to detect a first circuit abnormality and a second circuit abnormality detector configured to detect a second circuit abnormality, to thereby be able to secure fail-safe. In this case, the above-mentioned controller is configured to diagnose the diagnosis target including not only the derailment detector but also the first circuit abnormality detector and the second circuit abnormality detector.

Second Embodiment

In a second embodiment of the present invention, an elevator derailment detection device configured to detect derailment by a method different from that of the first embodiment is described. In the second embodiment, description of the same point as that of the first embodiment is omitted, and description of point different from that of the first embodiment is mainly described.

Figure 5:
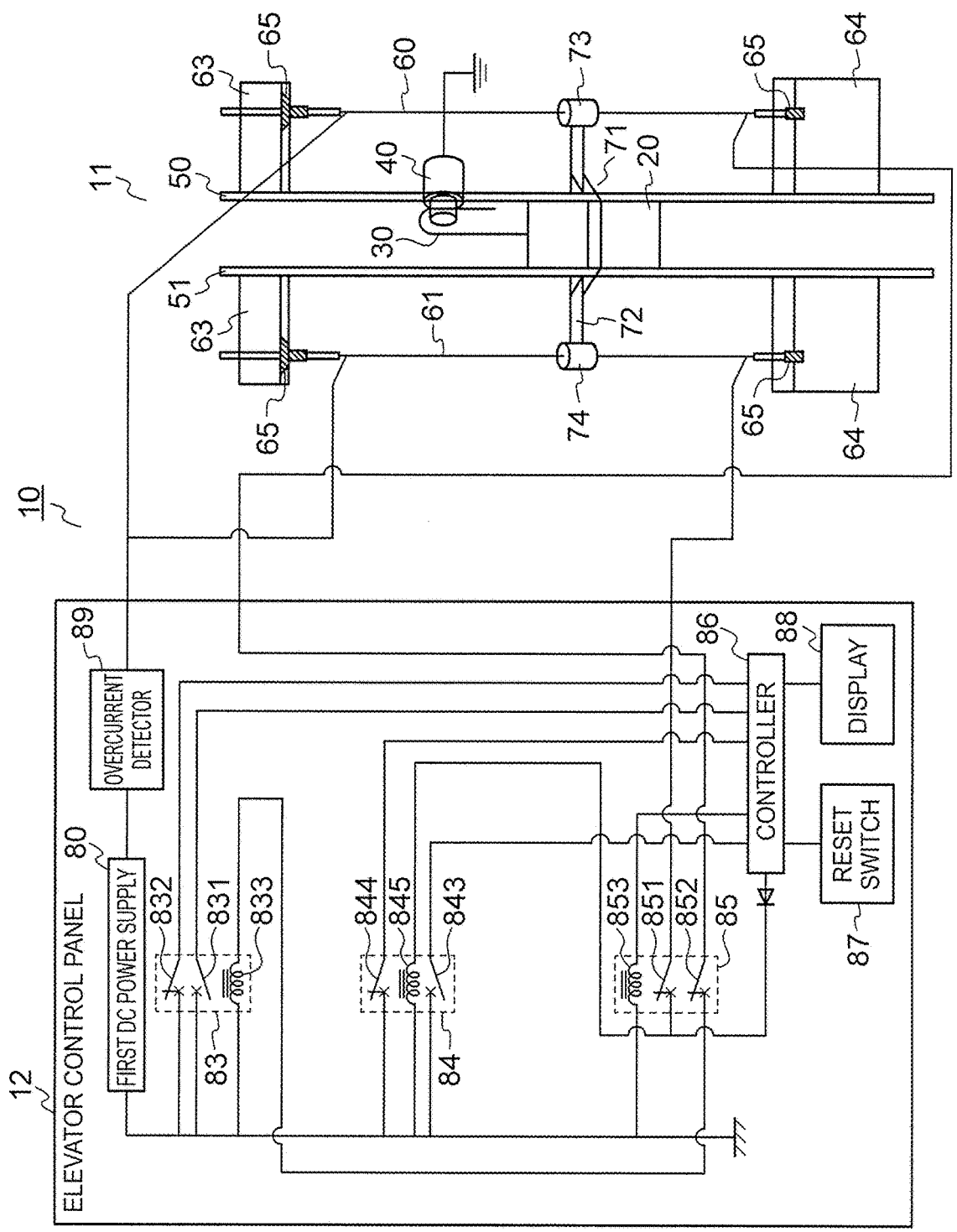
FIG. 5 is a schematic diagram for illustrating a configuration of an elevator system including an elevator derailment detection device according to a second embodiment of the present invention.

FIG. 5 is a schematic diagram for illustrating a configuration of the elevator system 10 including the elevator derailment detection device according to the second embodiment of the present invention.

As illustrated in FIG. 5, unlike in the first embodiment, the counterweight 20 is provided with the contact member 71 without the intermediation of the insulator 70. With such a configuration, when the first contact portion 73 and the second contact portion 74 are brought into contact with the first conductive wire 60 and the second conductive wire 61, respectively, due to an occurrence of derailment, the first conductive wire 60 and the second conductive wire 61 are brought into conduction with each other via the contact member 71, and the contact member 71 and the hoisting machine 40 are also brought into conduction with each other via the main rope 30.

When the contact member 71 and the hoisting machine 40 are brought into conduction with each other, a current flows from the first DC power supply 80 to the hoisting machine 40 to cause a ground fault, and as a result, an overcurrent flows into the first DC power supply 80.

In this manner, the contact member 71 is brought into contact with the first conductive wire 60 and the second conductive wire 61 when derailment occurs, to thereby bring the first conductive wire 60 and the second conductive wire 61 into conduction with each other and achieve a state in which an overcurrent flows into the first DC power supply 80.

The elevator control panel 12 includes: the power supply unit including the first DC power supply 80; the first circuit abnormality detection relay 83, which is an example of the first circuit abnormality detector; the second circuit abnormality detection relay 84, which is an example of the second circuit abnormality detector; the switching relay 85, which is an example of the switch; the controller 86; the reset switch 87; the display 88; and an overcurrent detector 89. A combination of the first circuit abnormality detection relay 83 and the second circuit abnormality detection relay 84 is an example of the derailment detector.

The first DC power supply 80 is configured to cause a current to flow through the first conductive wire 60 and the second conductive wire 61. In this manner, the first DC power supply 80 outputs the first DC voltage, to thereby apply the voltage to the first conductive wire 60 and the second conductive wire 61.

The second circuit abnormality detection relay 84 has a different configuration from that of the first embodiment, and includes an NO contact 843, an NC contact 844, and a coil 845. The second circuit abnormality detection relay 84 is a force-guided contact relay, and is classified as a contact relay.

One end of the first DC power supply 80 is connected to one end of the first conductive wire 60, and is further connected to one end of the second conductive wire 61. The other end of the first DC power supply 80 is connected to the other end of the first conductive wire 60 via the coil 833 of the first circuit abnormality detection relay 83 and the NC contact 852 of the switching relay 85, and is further connected to the other end of the second conductive wire 61 via the coil 845 of the second circuit abnormality detection relay 84 and the NC contact 851 of the switching relay 85.

The first conductive wire 60 and the second conductive wire 61 are connected in parallel with each other to form a parallel circuit, and the first DC power supply 80 applies a voltage to each of the first conductive wire 60 and the second conductive wire 61.

The first circuit abnormality detection relay 83 and the second circuit abnormality detection relay 84 are each configured so that a range for the normal operation has an upper limit of about the first DC voltage, that is, about 24 V.

The overcurrent detector 89 is configured to detect an overcurrent flowing into the first DC power supply 80 when the contact member 71 and the hoisting machine 40 are brought into conduction with each other. When no overcurrent flows into the first DC power supply 80, the overcurrent detector 89 avoids operating, and remains in a closed state. When an overcurrent flows into the first DC power supply 80, the overcurrent detector 89 detects the overcurrent, and operates to be switched from a closed state to an open state. When the overcurrent detector 89 is switched from a closed state to an open state, the first DC power supply 80 is cut off from the circuit, and as a result, the voltage stops being applied to both the first conductive wire 60 and the second conductive wire 61.

Respective detection results of the first circuit abnormality detection relay 83 and the second circuit abnormality detection relay 84 are input to the controller 86. The controller 86 determines based on those inputs whether each of derailment, a first circuit abnormality, and a second circuit abnormality has occurred.

The controller 86 is configured to perform diagnosis processing for diagnosing a diagnosis target including the first circuit abnormality detection relay 83 and the second circuit abnormality detection relay 84. When performing the diagnosis processing, the controller 86 controls the state of the coil 853 to an excited state, to thereby bring both the NC contact 851 and the NC contact 852 into an open state.

Meanwhile, when the diagnosis processing is not to be performed by the controller 86, the state of the coil 853 is not brought into an excited state, and hence the NC contact 851 and the NC contact 852 both remain in a closed state.

Now, each of the derailment detection function, the circuit abnormality detection function, and the diagnosis function of the elevator control panel 12 in the second embodiment is described with reference to FIG. 6. FIG. 6 is a table for showing respective states of the first circuit abnormality detection relay 83, the second circuit abnormality detection relay 84, and the switching relay 85 for each state of the elevator 11, in the second embodiment of the present invention.

First, an operation of the elevator control panel 12 performed when the elevator 11 is normal is described. When the elevator 11 is normal, in the same manner as in the first embodiment, the first conductive wire 60 and the second conductive wire 61 are not brought into conduction with each other.

A voltage of 24 V output from the first DC power supply 80 is applied to the first conductive wire 60, the coil 833 of the first circuit abnormality detection relay 83, the second conductive wire 61, and the coil 845 of the second circuit abnormality detection relay 84. In this case, the coil 833 is excited to bring the NO contact 831 into a closed state and bring the NC contact 832 into an open state, and the coil 845 is also excited to bring the NO contact 843 into a closed state and bring the NC contact 844 into an open state.

In this manner, when the elevator 11 is normal, as shown in FIG. 6, the NO contact 831, the NC contact 832, the NO contact 843, and the NC contact 844 are in a closed state, an open state, a closed state, and an open state, respectively.

When the NO contact 831, the NC contact 832, the NO contact 843, and the NC contact 844 are in a closed state, an open state, a closed state, and an open state, respectively, the controller 86 determines that the elevator 11 is normal.

<Derailment Detection Function>

Next, the derailment detection function of the elevator control panel 12 is described.

When derailment occurs in the elevator 11, the first conductive wire 60 and the second conductive wire 61 are brought into conduction with each other via the contact member 71 in the same manner as in the first embodiment, and the contact member 71 and the hoisting machine 40 are also brought into conduction with each other via the main rope 30. In this case, a ground-fault current flows through the path of the first DC power supply 80, the first conductive wire 60, the contact member 71, the counterweight 20, the main rope 30, the hoisting machine 40, and the ground. When such a ground-fault current occurs, the overcurrent detector 89 operates. That is, the overcurrent detector 89 detects this ground-fault current as an overcurrent, to thereby be switched from a closed state to an open state.

When the overcurrent detector 89 detects the overcurrent and operates, the first DC power supply 80 is cut off from the circuit as described above. When the first DC power supply 80 is cut off from the circuit, the voltage of the first DC power supply 80 stops being applied to both the coil 833 of the first circuit abnormality detection relay 83 and the coil 845 of the second circuit abnormality detection relay 84. In this case, the coil 833 is switched from an excited state to a non-excited state, to thereby bring the NO contact 831 into an open state and bring the NC contact 832 into a closed state. In the same manner, the coil 845 is switched from an excited state to a non-excited state, to thereby bring the NO contact 843 into an open state and bring the NC contact 844 into a closed state.

In this manner, when derailment occurs, as shown in FIG. 6, the first circuit abnormality detection relay 83 has the NO contact 831 switched from a closed state to an open state, and has the NC contact 832 switched from an open state to a closed state, and the second circuit abnormality detection relay 84 also has the NO contact 843 switched from a closed state to an open state, and has the NC contact 844 switched from an open state to a closed state.

That is, the first circuit abnormality detection relay 83 and the second circuit abnormality detection relay 84, which form the derailment detector, are configured to detect derailment by detecting that the overcurrent detector 89 has operated.

The controller 86 determines that derailment has occurred in response to detection results obtained by the first circuit abnormality detection relay 83 and the second circuit abnormality detection relay 84, namely, results that the NO contact 831 has been brought into an open state, the NC contact 832 has been brought into a closed state, the NO contact 843 has been brought into an open state, and the NC contact 844 has been brought into a closed state.

<Circuit Abnormality Detection Function>

Next, the circuit abnormality detection function of the elevator control panel 12 is described.

In the same manner as in the first embodiment, the elevator control panel 12 is configured to detect the first circuit abnormality, in which the first DC power supply 80 and the first conductive wire 60 are brought into a non-conductive state with each other, and the second circuit abnormality, in which the first DC power supply 80 and the second conductive wire 61 are brought into a non-conductive state with each other.

Even in a case where no derailment has occurred in the elevator 11, when there occurs a break in the first conductive wire 60 as an example of the first circuit abnormality, the voltage of the first DC power supply 80 stops being applied to the coil 833 of the first circuit abnormality detection relay 83. In this case, the coil 833 is switched from an excited state to a non-excited state, to thereby bring the NO contact 831 into an open state and bring the NC contact 832 into a closed state.

In this manner, when a first circuit abnormality occurs, as shown in FIG. 6, the first circuit abnormality detection relay 83 has the NO contact 831 switched from the closed state to the open state, and has the NC contact 832 switched from the open state to the closed state.

That is, the first circuit abnormality detection relay 83 is configured to detect a first circuit abnormality by detecting that no voltage is being applied to the first conductive wire 60. More specifically, the first circuit abnormality detection relay 83 operates when the voltage is being applied to the first conductive wire 60, and avoids operating when no voltage is being applied to the first conductive wire 60, to thereby detect a first circuit abnormality.

The controller 86 determines that a first circuit abnormality has occurred in response to a detection result obtained by the first circuit abnormality detection relay 83, namely, a result that the NO contact 831 has been brought into an open state and the NC contact 832 has been brought into a closed state.

Even in a case where no derailment has occurred in the elevator 11, when there occurs a break in the second conductive wire 61 as an example of the second circuit abnormality, the voltage of the first DC power supply 80 stops being applied to the coil 845 of the second circuit abnormality detection relay 84. In this case, the coil 845 is switched from an excited state to a non-excited state, to thereby bring the NO contact 843 into an open state and bring the NC contact 844 into a closed state.

In this manner, when a second circuit abnormality occurs, as shown in FIG. 6, the second circuit abnormality detection relay 84 has the NO contact 843 switched from the closed state to the open state, and has the NC contact 844 switched from the open state to the closed state.

That is, the second circuit abnormality detection relay 84 is configured to detect a second circuit abnormality by detecting that no voltage is being applied to the second conductive wire 61. More specifically, the second circuit abnormality detection relay 84 operates when the voltage is being applied to the second conductive wire 61, and avoids operating when no voltage is being applied to the second conductive wire 61, to thereby detect a second circuit abnormality.

The controller 86 determines that a second circuit abnormality has occurred in response to a detection result obtained by the second circuit abnormality detection relay 84, namely, a result that the NO contact 843 has been brought into an open state and the NC contact 844 has been brought into a closed state.

<Diagnosis Function>

Next, the diagnosis function of the elevator control panel 12 is described with reference to FIG. 7. FIG. 7 is a flow chart for illustrating a series of diagnostic processing procedures to be performed by the controller 86 of the elevator control panel 12 in the second embodiment of the present invention.

In Step S201, the controller 86 controls the state of the coil 853 of the switching relay 85 to an excited state, to thereby bring both the NC contact 851 and the NC contact 852 into an open state. After the execution of Step S201, the processing proceeds to Step S202.

In Step S202, the controller 86 inspects behaviors of the first circuit abnormality detection relay 83 and the second circuit abnormality detection relay 84, which are involved in the execution of Step S201, to thereby diagnose the soundness of the first circuit abnormality detection relay 83 and the second circuit abnormality detection relay 84. After the execution of Step S202, the processing proceeds to Step S203.

Here, when the NC contact 851 and the NC contact 852 are both switched from a closed state to an open state, the state of connection between the power supply unit and the diagnosis target is switched from a conductive state to a non-conductive state.

In this case, when the first circuit abnormality detection relay 83 is normal, the NO contact 831 is switched from a closed state to an open state, and the NC contact 832 is switched from an open state to a closed state. In addition, when the second circuit abnormality detection relay 84 is normal, the NO contact 843 is switched from a closed state to an open state, and the NC contact 844 is switched from an open state to a closed state.

In view of this, the controller 86 is configured to switch the state of connection between the power supply unit and the diagnosis target from a conductive state to a non-conductive state, to thereby inspect the behavior of the diagnosis target.

The controller 86 determines that the first circuit abnormality detection relay 83 is sound when the NO contact 831 is switched from a closed state to an open state and the NC contact 832 is switched from an open state to a closed state, and otherwise determines that the first circuit abnormality detection relay 83 is unsound.

Further, the controller 86 determines that the second circuit abnormality detection relay 84 is sound when the NO contact 843 is switched from a closed state to an open state and the NC contact 844 is switched from an open state to a closed state, and otherwise determines that the second circuit abnormality detection relay 84 is unsound.

Subsequently, in Step S203, the controller 86 controls the state of the coil 853 of the switching relay 85 to a non-excited state, to thereby bring both the NC contact 851 and the NC contact 852 into a closed state. After the execution of Step S203, the processing proceeds to Step S204.

In Step S204, the controller 86 inspects behaviors of the first circuit abnormality detection relay 83 and the second circuit abnormality detection relay 84, which are involved in the execution of Step S203, to thereby diagnose the soundness of the first circuit abnormality detection relay 83 and the second circuit abnormality detection relay 84. After the execution of Step S204, the processing is terminated.

Here, when the NC contact 851 and the NC contact 852 are both switched from an open state to a closed state, the state of connection between the power supply unit and the diagnosis target is switched from a non-conductive state to a conductive state.

In this case, when the first circuit abnormality detection relay 83 is normal, the NO contact 831 is switched from an open state to a closed state, and the NC contact 832 is switched from a closed state to an open state. In addition, when the second circuit abnormality detection relay 84 is normal, the NO contact 843 is switched from an open state to a closed state, and the NC contact 844 is switched from a closed state to an open state.

In view of this, the controller 86 is configured to switch the state of connection between the power supply unit and the diagnosis target from a conductive state to a non-conductive state and then switch the state from a non-conductive state to a conductive state, to thereby inspect the behavior of the diagnosis target.

The controller 86 determines that the first circuit abnormality detection relay 83 is sound when the NO contact 831 is switched from an open state to a closed state and the NC contact 832 is switched from a closed state to an open state, and otherwise determines that the first circuit abnormality detection relay 83 is unsound.

Further, the controller 86 determines that the second circuit abnormality detection relay 84 is sound when the NO contact 843 is switched from an open state to a closed state and the NC contact 844 is switched from a closed state to an open state, and otherwise determines that the second circuit abnormality detection relay 84 is unsound.

In this manner, the controller 86 controls the switching relay 85 in the diagnosis processing to inspect the behavior of the diagnosis target, to thereby diagnose the soundness of the diagnosis target. As a result of performing the diagnosis processing, the controller 86 emergency-stops the elevator 11 when there is an unsound spot.

As described above, according to the second embodiment, the elevator derailment detection device includes: a first conductive wire and a second conductive wire, which are provided in a hoistway in parallel with the elevating direction of an elevating body; a derailment detector configured to detect derailment; a power supply unit including a first DC power supply configured to output a first DC voltage to apply a voltage to the first conductive wire and the second conductive wire; and a contact member, which is provided to the elevating body, and is configured to be brought into contact with the first conductive wire and the second conductive wire when the derailment occurs, to thereby bring the first conductive wire and the second conductive wire into conduction with each other and achieve a state in which an overcurrent flows into the first DC power supply. The above-mentioned derailment detector is configured to detect derailment by detecting the overcurrent.

In addition to the above-mentioned components, the above-mentioned elevator derailment detection device further includes: a switch configured to switch a state of connection between the power supply unit and a diagnosis target, which includes the derailment detector, between the conductive state and the non-conductive state; and a controller configured to perform diagnosis processing for diagnosing the diagnosis target. The above-mentioned controller is configured to control the switch in the diagnosis processing to inspect the behavior of the diagnosis target, to thereby diagnose the soundness of the diagnosis target.

Even when the elevator derailment detection device is thus configured, the same effects as those of the first embodiment can be produced.

In the first and second embodiments, description has been made of a case, as an example, in which the counterweight 20 is used for the target elevating body to be detected about the derailment, but the car may be used instead as the elevating body for which derailment is to be detected. That is, the contact member 71 may be provided to the car to detect whether the car has disengaged from a guide rail. Further, the present invention can be applied not only to the elevator system 10 of the type illustrated in FIG. 1 but also to elevator systems 10 of various types.

REFERENCE SIGNS LIST

10 elevator system, 11 elevator, 12 elevator control panel, 20 counterweight, 30 main rope, 40 hoisting machine, 50 first guide rail, 51 second guide rail, 60 first conductive wire, 61 second conductive wire, 62a first wiring, 62b second wiring, 63 upper end fixing portion, 64 lower end fixing portion, 65 insulator, 70 insulator, 71 contact member, 72 support portion, 73 first contact portion, 74 second contact portion, 80 first DC power supply, 81 second DC power supply, 82 derailment detection relay, 821 NO contact, 822 NC contact, 823 coil, 83 first circuit abnormality detection relay, 831 NO contact, 832 NC contact, 833 coil, 84 second circuit abnormality detection relay, 841 light emitting diode, 842 phototransistor, 843 NO contact, 844 NC contact, 845 coil, 85 switching relay, 851 NC contact, 852 NC contact, 853 coil, 86 controller, 87 reset switch, 88 display, 89 overcurrent detector.

The invention claimed is:

1. An elevator derailment detection device, which is configured to detect derailment in which an elevating body guided by a guide rail to raise and lower disengages from the guide rail, the elevator derailment detection device comprising:
    a first conductive wire and a second conductive wire, which are provided in a hoistway in parallel with an elevating direction of the elevating body;
    a derailment detector configured to detect the derailment;
    a power supply including a first DC power supply configured to output a first DC voltage to apply a voltage to the first conductive wire and a second DC power supply configured to output a second DC voltage, which is lower than the first DC voltage, to apply a voltage to the second conductive wire;
    a contact, at the elevating body, and is configured to be brought into contact with the first conductive wire and the second conductive wire when the derailment occurs, to thereby bring the first conductive wire and the second conductive wire into conduction with each other;
a switch configured to switch a state of connection between the power supply and a diagnosis target, which includes the derailment detector, between a conductive state and a non-conductive state; and
a controller configured to perform diagnosis processing for diagnosing the diagnosis target,
wherein the derailment detector is configured to detect the derailment by detecting that the voltage applied to the second conductive wire has increased to a level higher than the voltage applied to the second conductive wire when the derailment has not occurred, and
wherein the controller is configured to control the switch in the diagnosis processing to inspect a behavior of the diagnosis target, to thereby diagnose soundness of the diagnosis target.

2. The elevator derailment detection device according to claim 1, wherein the derailment detector includes a relay configured to operate when the voltage applied to the second conductive wire has increased to a level higher than the voltage applied to the second conductive wire when the derailment has not occurred.

3. The elevator derailment detection device according to claim 1, further comprising:
a first circuit abnormality detector configured to detect a first circuit abnormality, in which the first DC power supply and the first conductive wire are brought into the non-conductive state with each other; and
a second circuit abnormality detector configured to detect a second circuit abnormality, in which the second DC power supply and the second conductive wire are brought into the non-conductive state with each other,
wherein the first circuit abnormality detector is configured to detect the first circuit abnormality by detecting that no voltage is being applied to the first conductive wire,
wherein the second circuit abnormality detector is configured to detect the second circuit abnormality by detecting that no voltage is being applied to the second conductive wire, and
wherein the controller is configured to diagnose the diagnosis target further including the first circuit abnormality detector and the second circuit abnormality detector.

4. The elevator derailment detection device according to claim 3,
wherein the first circuit abnormality detector includes a relay configured to operate when a voltage is being applied to the first conductive wire, and
wherein the second circuit abnormality detector includes a relay configured to operate when a voltage is being applied to the second conductive wire.

5. The elevator derailment detection device according to claim 1, wherein the switch includes a relay configured to operate when an electric signal is input from the controller, to thereby switch the state of connection between the power supply and the diagnosis target from the conductive state to the non-conductive state.

6. The elevator derailment detection device according to claim 1, wherein the controller is configured to inspect the behavior of the diagnosis target by switching the state of connection between the power supply and the diagnosis target from the conductive state to the non-conductive state in the diagnosis processing.

7. The elevator derailment detection device according to claim 1,
wherein the diagnosis target is configured to operate when an electric signal is input from the controller, and
wherein the controller is configured to inspect the behavior of the diagnosis target by switching the state of connection between the power supply and the diagnosis target from the conductive state to the non-conductive state in the diagnosis processing, outputting the electric signal to the diagnosis target, and then stopping outputting the electric signal.

8. The elevator derailment detection device according to claim 6, wherein the controller is configured to inspect the behavior of the diagnosis target by further switching the state of connection between the power supply and the diagnosis target from the non-conductive state to the conductive state in the diagnosis processing.

9. The elevator derailment detection device according to claim 1, further comprising a reset switch, which is switchable between an on state and an off state, and is configured to output an on signal to the controller when the reset switch is turned on,
wherein the controller is configured to determine that the derailment has occurred when the derailment is detected by the derailment detector, and to redetermine that the derailment has not occurred when the on signal is input from the reset switch in a case where the controller has determined that the derailment has occurred, and
wherein the controller is configured to further diagnose the soundness of the reset switch in the diagnosis processing based on whether the on signal is input from the reset switch.

10. An elevator derailment detection device, which is configured to detect derailment in which an elevating body guided by a guide rail to raise and lower disengages from the guide rail, the elevator derailment detection device comprising:
a first conductive wire and a second conductive wire, which are provided in a hoistway in parallel with an elevating direction of the elevating body;
a derailment detector configured to detect the derailment;
a power supply including a first DC power supply configured to output a first DC voltage to apply a voltage to the first conductive wire and the second conductive wire;
a contact, at the elevating body, and is configured to be brought into contact with the first conductive wire and the second conductive wire when the derailment occurs, to thereby bring the first conductive wire and the second conductive wire into conduction with each other and achieve a state in which an overcurrent flows into the first DC power supply;
a switch configured to switch a state of connection between the power supply and a diagnosis target, which includes the derailment detector, between a conductive state and a non-conductive state; and
a controller configured to perform diagnosis processing for diagnosing the diagnosis target,
wherein the derailment detector is configured to detect the derailment by detecting the overcurrent, and
wherein the controller is configured to control the switch in the diagnosis processing to inspect a behavior of the diagnosis target, to thereby diagnose soundness of the diagnosis target.

11. The elevator derailment detection device according to claim 10, further comprising:

a first circuit abnormality detector configured to detect a first circuit abnormality, in which the first DC power supply and the first conductive wire are brought into the non-conductive state with each other; and a second circuit abnormality detector configured to detect a second circuit abnormality, in which the first DC power supply and the second conductive wire are brought into the non-conductive state with each other, wherein the first circuit abnormality detector is configured to detect the first circuit abnormality by detecting that no voltage is being applied to the first conductive wire, wherein the second circuit abnormality detector is configured to detect the second circuit abnormality by detecting that no voltage is being applied to the second conductive wire, and wherein the controller is configured to diagnose the diagnosis target further including the first circuit abnormality detector and the second circuit abnormality detector.

12. The elevator derailment detection device according to claim 11, further comprising an overcurrent detector configured to detect the overcurrent, wherein the derailment detector includes the first circuit abnormality detector and the second circuit abnormality detector, and wherein the first circuit abnormality detector and the second circuit abnormality detector are configured to detect the derailment by detecting that the overcurrent detector has operated.

13. The elevator derailment detection device according to claim 11, wherein the first circuit abnormality detector includes a relay configured to operate when a voltage is being applied to the first conductive wire, and wherein the second circuit abnormality detector includes a relay configured to operate when a voltage is being applied to the second conductive wire.

14. The elevator derailment detection device according to claim 10, wherein the switch includes a relay configured to operate when an electric signal is input from the controller, to thereby switch the state of connection between the power supply and the diagnosis target from the conductive state to the non-conductive state.

15. The elevator derailment detection device according to claim 10, wherein the controller is configured to inspect the behavior of the diagnosis target by switching the state of connection between the power supply and the diagnosis target from the conductive state to the non-conductive state in the diagnosis processing.

16. The elevator derailment detection device according to claim 10, wherein the diagnosis target is configured to operate when an electric signal is input from the controller, and wherein the controller is configured to inspect the behavior of the diagnosis target by switching the state of connection between the power supply and the diagnosis target from the conductive state to the non-conductive state in the diagnosis processing, outputting the electric signal to the diagnosis target, and then stopping outputting the electric signal.

17. The elevator derailment detection device according to claim 10, further comprising a reset switch, which is switchable between an on state and an off state, and is configured to output an on signal to the controller when the reset switch is turned on, wherein the controller is configured to determine that the derailment has occurred when the derailment is detected by the derailment detector, and to redetermine that the derailment has not occurred when the on signal is input from the reset switch in a case where the controller has determined that the derailment has occurred, and wherein the controller is configured to further diagnose the soundness of the reset switch in the diagnosis processing based on whether the on signal is input from the reset switch.

* * * * *